(12) United States Patent
Lu

(10) Patent No.: US 6,456,358 B1
(45) Date of Patent: Sep. 24, 2002

(54) SURFACE-TREATMENT APPARATUS FOR FORMING A PHOTORESIST-ISOLATING WALL ON A PANEL

(75) Inventor: Tien-Rong Lu, Tainan (TW)

(73) Assignee: Ritek Display Technology Co. (TW)

( * ) Notice: Subject to any disclaimer, the term of this patent is extended or adjusted under 35 U.S.C. 154(b) by 0 days.

(21) Appl. No.: 09/563,933

(22) Filed: May 4, 2000

(30) Foreign Application Priority Data

Apr. 26, 2000 (TW) ...................................... 089206837 U

(51) Int. Cl.$^7$ .......................... G03F 7/00; G03B 27/32; G03D 5/00; B65G 49/07

(52) U.S. Cl. .................. 355/27; 430/321; 430/325; 430/326; 430/330; 430/322; 396/611; 414/935

(58) Field of Search ................................ 430/321, 322, 430/325, 326, 330; 355/27; 396/611; 414/935

(56) References Cited

U.S. PATENT DOCUMENTS

| | | | | |
|---|---|---|---|---|
| 3,635,711 A | * | 1/1972 | Miller et al. ................. 96/35.1 |
| 5,430,303 A | * | 7/1995 | Matsumoto et al. ..... 250/492.2 |
| 5,932,380 A | * | 8/1999 | Yaegashi et al. ............... 430/30 |
| 6,002,108 A | * | 12/1999 | Yoshioka ..................... 219/388 |
| 6,004,721 A | * | 12/1999 | Tan et al. ................. 430/270.1 |
| 6,037,097 A | * | 3/2000 | Buccignano et al. .... 430/270.1 |
| 6,171,765 B1 | * | 1/2001 | Sheats ......................... 430/330 |
| 2001/0035714 A1 | * | 11/2001 | Lu ............................... 313/504 |

* cited by examiner

*Primary Examiner*—Mark F. Huff
*Assistant Examiner*—Nicole Barreca
(74) *Attorney, Agent, or Firm*—Lowe Hauptman Gilman & Berner, LLP

(57) ABSTRACT

The present invention provides a surface-treatment apparatus for forming a plurality of photoresist-isolating walls on an organic electroluminescent panel. The surface-treatment apparatus has a photoresist-coating module, a prebaking unit, an exposure unit, a post-exposure surface treatment module with an alkaline atmosphere, a development module and a hard baking unit. The photoresist-coating module coats a photoresist layer on the surface of the organic electroluminescent panel. The prebaking unit bakes the photoresist layer on the organic electroluminescent panel by a heating plate and initially drives solvents from the photoresist layer. The exposure unit performs an UV exposure process on the photoresist layer after the prebaking. The post-exposure surface treatment module with an alkaline atmosphere bakes the photoresist layer by a heating plate after the exposure process, wherein the alkaline atmosphere surfacely terminates a self-catalyzed reaction of photo-acid ions of the photoresist layer. The development module performs a developing process on the photoresist layer after the post-exposure surface treatment so as to form the plurality of photoresist-isolating walls with a T-shaped top. The hard baking unit bakes the plurality of photoresist-isolating walls by a heating plate, further reduces the solvents remaining in the photoresist-isolating walls, and improve the strength and stability of the photoresist-isolating walls.

10 Claims, 3 Drawing Sheets

SURFACE-TREATMENT APPARATUS FOR FORMING A PHOTORESIST-ISOLATING WALL ON A PANEL

BACKGROUND OF THE INVENTION

1. Field of the Invention

The present invention relates to a surface-treatment apparatus, and more particularly, to a surface-treatment apparatus for forming a photoresist-isolating wall on a panel.

2. Description of the Prior Art

Currently, an organic electroluminescent diode (OELD) panel with light weight, high contrast, fast response speed, low power consumption and high brightness becomes the focus of the innovative generation panel. However, compared with other mature panels, since the OELD panel is the latest without perfect techniques available, there are many difficulties in commercialization and mass production.

In the prior art of forming the OELD panel, a plurality of photoresist-isolating walls is perpendicularly formed on a plurality of anode electrodes to be a shadow mask. An organic electroluminescent layer and a cathode electrode are then evaporated ont he anode electrodes between two adjacent photoresist-isolating walls. However, when the cross section of the photoresist-isolating wall is approximately rectangular, the cathode electrodes on the top of the photoresist-isolating wall easily laterally diffuse to contact the anode electrodes during the evaporation. It will cause a short circuit, especially when the thickness of the photoresist-isolating wall is less than 4 $\mu$m. In the technology disclosed in U.S. Pat. No. 5,962,970, such a photoresist-isolating wall is manufactured as a reverse-trapezoid cross section wherein the top is wider than the bottom to form a protruding portion. Yet, there are still several difficulties described hereinafter. First, the height (or thickness) of the photo-resist-isolating wall with the reverse-trapezoid cross section is limited. If the height is less than 4 $\mu$m, the protruding portion will become too small to segregate the lateral diffusing cathode materials and the anodes. It is also incapable of improving the resolution of the current panel with less than 10 $\mu$m linewidth. If the height is more than 4 $\mu$m, the photoresist-separating wall is apt to collapse. Also, it does not fit in the market requirement in the thin, light, short and compact display. Second, the protruding portion of the reverse-trapezoid is not easily controlled. The formation of the photoresist-isolating walls with the reverse-trapezoid cross section comprises an exposure through a mask to define a pattern and a development to shape the walls. Yet, since there are many limitations in the exposure and the development, it is difficult to form the expected reverse-trapezoid cross section. Also, the following evaporation of the organic electroluminescent layer reduces the protruding portion of the wall. When the cathode electrode is next evaporated on the organic electroluminescent layer, it is possible to connect the cathode electrode and the anode electrode and cause the short circuit.

In the technology disclosed in U.S. Pat. Ser. Nos. 6,013, 538, another photoresist-isolating wall is manufactured as a T-shaped top by multi-layer undercutting. Nevertheless, the multi-layer undercutting which comprises repeatedly coating, developing and etching has difficulties in controlling the thickness, the linewidth and the accuracy of the pattern. Also, the procedure is too complex to ensure the manufacturing quality and the production cost is too expensive to apply to the mass production. In consideration of the above mentions, it is needed to provide a surface-treatment apparatus to form the photoresist-isolating wall with the T-shaped top and avoid causing the above-mentioned disadvantages.

SUMMARY OF THE INVENTION

It is therefore a primary objective of the present invention to provide a surface-treatment apparatus for forming a photoresist-isolating wall with a T-shaped top on an OELD panel to avoid a short circuit.

In a preferred embodiment, the present invention provides a surface-treatment apparatus for forming a plurality of photoresist-isolating walls on an organic electroluminescent panel. The surface-treatment apparatus comprises a photoresist-coating module, a prebaking unit, an exposure unit, a post-exposure surface treatment module with an alkaline atmosphere, a development module and a hard baking unit. The photoresist-coating module coats a photoresist layer on the surface of the organic electroluminescent panel. The prebaking unit bakes the photoresist layer on the organic electroluminescent panel by a heating plate and initially drives solvents from the photoresist layer. The exposure unit performs an UV exposure process on the photoresist layer after the prebaking. The post-exposure surface treatment module with an alkaline atmosphere bakes the photoresist layer by a heating plate after the exposure process, wherein the alkaline atmosphere terminates a self-catalyzed reaction of photo-acid ions on the surface of the photoresist layer. The development module performs a developing process on the photoresist layer after the post-exposure surface treatment so as to form the plurality of photoresist-isolating walls with a T-shaped top. The hard baking unit bakes the plurality of photoresist-isolating walls by a heating plate, further reduces the solvents remaining in the photo-resist-isolating walls, and intensifies the strength and stability of photoresist-separating walls.

It is an advantage of the present invention that the surface-treatment apparatus improves the quality of the photoresist-isolating walls and lowers the production cost and failure. Also, the surface-treatment apparatus can be applied to manufacture an OELD panel with better resolution and production yield.

This and other objective of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
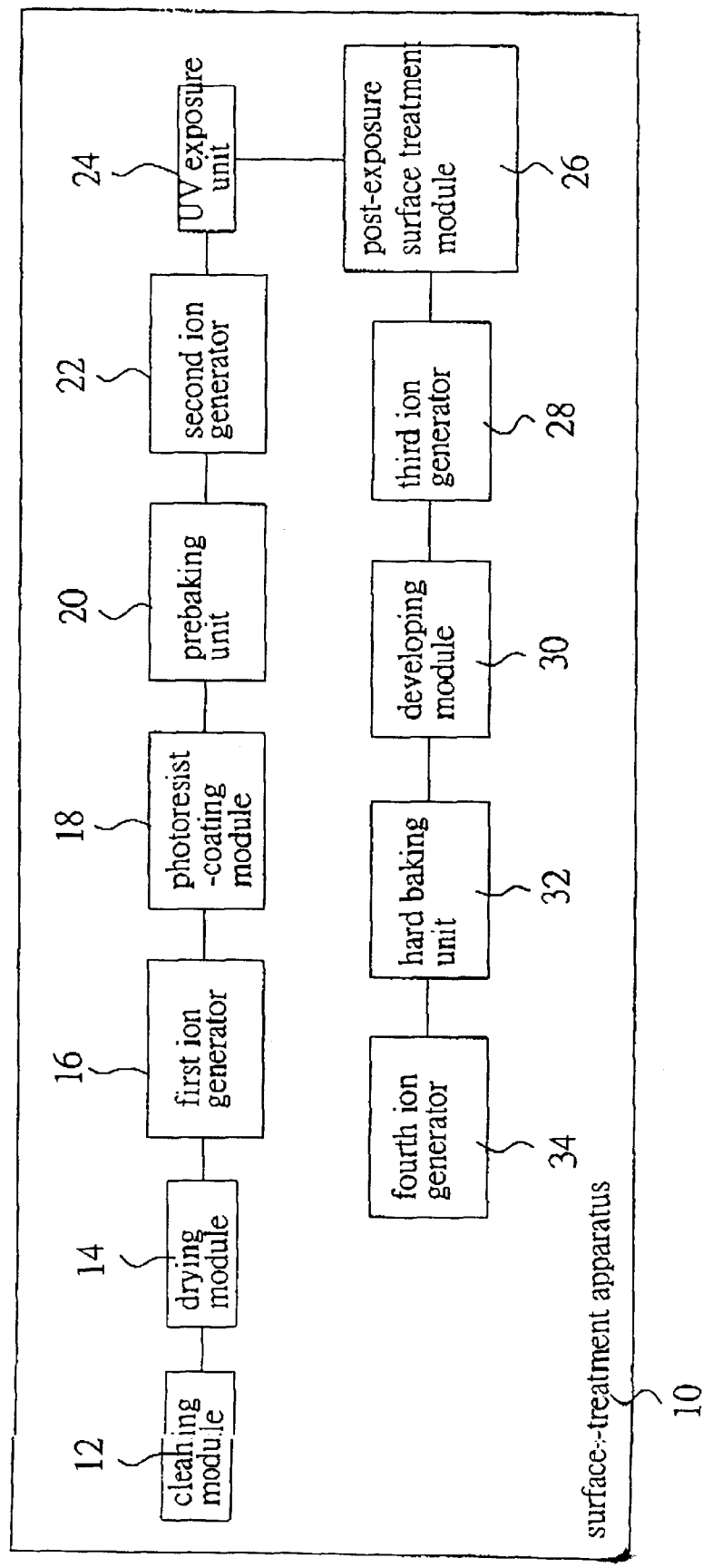
FIG. 1 is a block diagram of a surface-treatment of the present invention.

Please refer to FIG. 1. FIG. 1 is a block diagram of a surface-treatment apparatus 10 according to the present invention. A surface-treatment apparatus 10 is used to form a plurality of photoresist-isolating walls on an organic electroluminescent panel. The surface-treatment apparatus 10 comprises a cleaning module 12, a drying module 14, a first ion generator 16, a photoresist-coating coating module 18, a prebaking unit 20, a second ion generator 22, a exposure unit 24, a post-exposure surface treatment module 26 with an alkaline atmosphere, a third ion generator 28, a developing module 30, a hard baking unit 32 and a fourth generator 34. The photoresist-coating module 18 is used to coat a photoresist layer on the surface of the panel. The prebaking unit 20 is used to bake the photoresist layer on the panel by a heating plate and initially drive solvents from the photoresist layer. The exposure unit 24 is used to perform an UV exposure process on the photoresist layer after the prebaking. The post-exposure surface treatment module 26 with the alkaline atmosphere is used to terminates the self-catalyzed reaction of photo-acid ions on the surface of the photoresist layer, and to bake and reorganize the photoresist layer by a heating plate after the exposure process. The development module 30 is used to perform a developing process on the photoresist layer after the post exposure baking so as to form the plurality of photoresist-isolating walls. The hard baking unit 32 is used to bake the plurality of photoresist-isolating walls by a heating plate and further reduce the solvents remaining in the photoresist-isolating walls. The ion generators 16, 22, 28, 32 are used to remove the static electricity that will discharge and cause breakdown on the panel.

Figure 2:
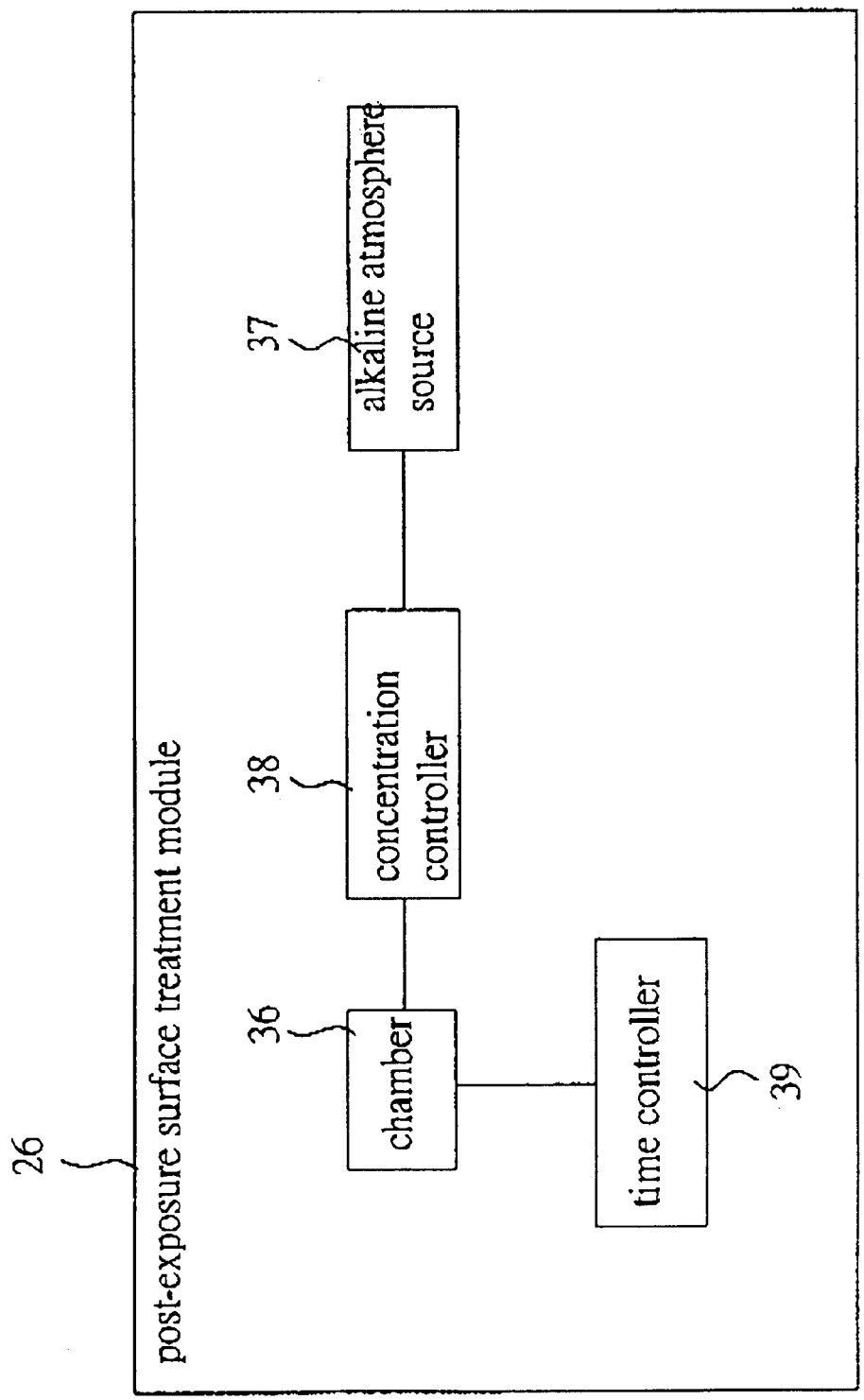
FIG. 2 is a block diagram of the post-exposure surface treatment module with the alkaline atmosphere shown in FIG. 1.

Please refer to FIG. 2. FIG. 2 is a block diagram of the post-exposure surface treatment module 26 with the alkaline atmosphere shown in FIG. 1. The post-exposure surface treatment module 26 comprises a chamber 36 where a heating plate (not shown) is installed for post exposure baking the photoresist layer, an alkaline atmosphere source 37 for providing the alkaline atmosphere, a concentration controller 38 where several filters with different filtering standards such as active charcoal are fitted, and a time controller 39 for controlling the processing time of the alkaline atmosphere and the post-exposure surface treatment. The photoresist layer is made of a chemical amplified photoresist composition that comprises photo-acid generators, at least one polymer such as tert-butoxy protective group, and at least one additive such as photo-acid quencher. The alkaline atmosphere is made of tetramethyl ammonium hydroxide, (TMAH) (($CH_3$)$_4$NOH), potassium hydroxide (KOH), or an exhaust alkaline gas that is made by recycling TMAH in the developing module 30 through the filtration of steam and impurities. In the exposure process, the photo-acid generators of the photoresist layer generate photo-acid ions. Then, in the post-exposure surface treatment, the photo-acid ions obtain sufficient energy to make the polymer on a deprotection reaction, which will promote a self-catalyzed reaction of the photo-acid ions. At the same time, the alkaline atmosphere filled in the chamber 36 surfacely neutralizes the photo-acid ions of the photoresist layer and then terminates the self-catalyzed reaction of photo-acid ions on the surface of the photoresist layer. Consequently, in the follow-up developing process, the top of the photoresist-isolating wall becomes the T shape wherein the protruding portion of the T-shaped top is used as a shadow mask.

Figure 3:
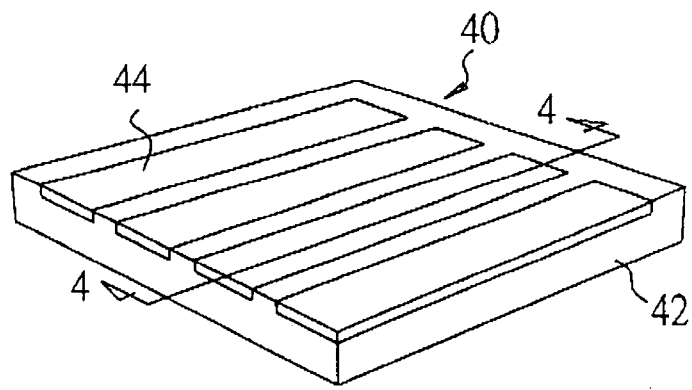
FIG. 3 to FIG. 5 are schematic diagrams of forming a plurality of photoresist-isolating walls by the surface-treatment apparatus shown in FIG. 1.
Figure 4:
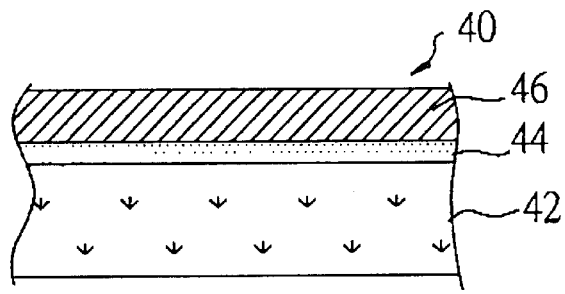
Figure 5:
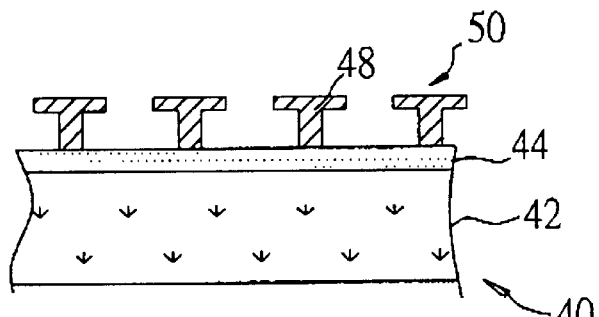

Please refer to FIG. 3 to FIG. 5. FIG. 3 to FIG. 5 are schematic diagrams of forming a plurality of photoresist-isolating walls by the surface-treatment apparatus 10 shown in FIG. 1. The surface-treatment apparatus 10 is used to form a plurality of photoresist-isolating wall 50 on an organic electroluminescent panel 40. As shown in FIG. 3, the organic electroluminescent panel 40 comprises a substrate 42, and a plurality of first electrodes 44 in parallel positioned on the substrate 42 corresponding to luminescent areas. First, the panel 40 is placed in the cleaning module 12 and the drying module 14 in sequence to clean and dry the surface of the panel 40. Then, the first ion generator 16 is used to remove the static electricity on the panel 40. Next, a chemical amplified photoresist composition is coated on the panel 40 in the photoresist-coating module 18 to be a photoresist layer 46 as shown in FIG. 4 that is a cross-section diagram along line 3—3 of the panel 40 shown in FIG. 3. Next, the panel 40 is baked in the prebaking unit 20 to drive the solvents from the photoresist layer 46 and then the static electricity is neutralized by the second ion generator 22. Next the exposure process is performed on the photoresist layer 46 by a mask with a predetermined pattern through a deep ultraviolet with 254 nm wave-length to make the photo-acid generators create photo-acid ions. After that, the photoresist layer 26 is baked in the post-exposure surface treatment unit 26 by a heating plate to promote the self-catalyzed reaction of the photo-acid ions in the photoresist layer 46. At the same time, the atmosphere filled in the post-exposure surface treatment unit 26 surfacely terminates the self-catalyzed reaction of the photo-acid ions of the photoresist layer 46. After employing the third ion generator 28 to neutralize the static electricity on the panel 40, the developing process is performed on the photoresist layer 46 in the developing module 30. Thereby, the plurality of parallel photoresist-isolating walls 50 with T-shaped top 48 is perpendicularly formed on the first electrodes 44 as shown in FIG. 5. Then, the photoresist-isolating walls 50 are baked by a heating plate in the hard baking unit 32 to further reduce the remaining solvents and to improve the strength and stability of the photoresist-isolating walls. Finally, the fourth ion generator 34 is employed to neutralize the static electricity on the panel 40 so as to complete the photoresist-isolating walls 50 with the T-shaped top 48.

Figure 6:
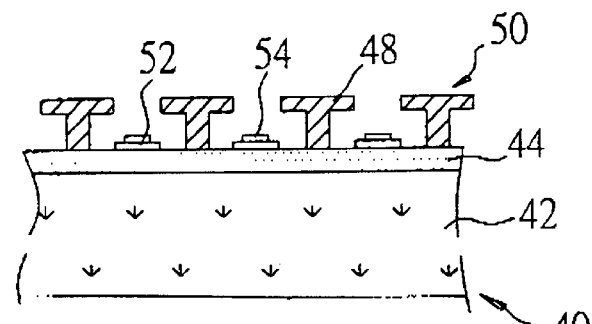
FIG. 6 is a schematic diagram of the organic electroluminescent panel according to the present invention.

Please refer to FIG. 6. FIG. 6 is a schematic diagram of the organic electroluminescent panel 40 according to the present invention. When the photoresist-isolating walls 50 are completed, an organic electroluminescent layer 52 is evaporated on the first electrodes between two adjacent photoresist-isolating walls 50. Then, a plurality of parallel second electrodes 54 is evaporated on the organic electroluminescent layer 52 wherein the second electrode 54 is perpendicular to the first electrode 44. The second electrodes 54 and the first electrodes 44 sandwich the organic electroluminescent layer 52 to form a plurality of luminescent pixels for emitting red, green or blue light in matrix array on the panel 40.

During the evaporation of the second electrodes 54, part of the second electrodes 54 coated on the protruding portion of the T-shaped top 48 will not laterally diffuse to contact the first electrodes 44. It is good to prevent the short circuit and increase the production quality and yield. Also, compared with the prior art of the photoresist-separating wall with reverse-trapezoid cross section, the height of the photoresist-isolating wall 50 can be lowered (less than 0.8 $\mu$m) and the bottom width of the photoresist-separating wall 50 can be lessened to significantly reduce the possibility of lateral diffusion during the evaporation of the second electrodes and to increase the resolution and the yield of the panel 40. Furthermore, compared with the prior art of the multi-layer undercutting, the surface-treatment apparatus 10 employs the post-exposure surface treatment unit 26 with the recycling alkaline atmosphere to the surface treatment of the photoresist layer 46 so as to form the photoresist-isolating wall 50 with the T-shaped top 48 in the developing process.

It economizes on production cost and processing time, diminishes the alkaline pollutant to environment, and therefore fits in mass production.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A surface-treatment apparatus for forming a plurality of photoresist-isolating walls on an organic electroluminescent diode (OELD) panel, said apparatus comprising:

a photoresist-coating module for coating a photoresist layer on the organic electroluminescent panel;

a prebaking unit for baking the photoresist layer and initially driving solvents from the photoresist layer;

an UV exposure unit for performing an exposure process on the photoresist layer after the prebaking;

a post-exposure surface treatment module having therein an alkaline atmosphere for baking the photoresist layer after the exposure process;

a development module for performing a developing process on the photoresist layer after the post exposure baking so as to form the photoresist-isolating walls; and a hard baking unit for baking the photoresist-isolating walls and further reducing the solvents remaining in the photoresist-isolating walls and improving the strength and stability of photoresist-isolating walls;

wherein the alkaline atmosphere in the post-exposure surface treatment module terminates a self-catalyzed reaction of photo-acid ions on the surface of the photoresist-layers so as to form the photoresist-isolating walls each having a T-shaped top in the developing process.

2. The surface-treatment apparatus of claim 1, wherein the post-exposure surface treatment module comprises an alkaline atmosphere source for providing the alkaline atmosphere, a concentration controller for controlling the concentration of the alkaline atmosphere, and a time controller for controlling the processing time of the alkaline atmosphere.

3. The surface-treatment apparatus of claim 2, wherein the alkaline atmosphere is made of tetramethyl ammonium hydroxide $((CH_3)_4NOH)$.

4. The surface-treatment apparatus of claim 2, wherein the alkaline atmosphere is made of potassium hydroxide (KOH).

5. The surface-treatment apparatus of claim 2, wherein the alkaline atmosphere is made by recycling the alkaline gas which is exhausted from the developing module.

6. The surface-treatment apparatus of claim 1, wherein the photoresist layer is a chemical amplified photoresist composition.

7. The surface-treatment apparatus of claim 6, wherein the chemical amplified photoresist composition comprises photo-acid generators.

8. The surface-treatment apparatus of claim 1, further comprising at least one ion generator for neutralizing static electricity on the organic electroluminescent diode panel.

9. The surface-treatment apparatus of claim 1, wherein the organic electroluminescent diode panel comprises a substrate and a plurality of parallel anode electrodes.

10. The surface-treatment apparatus of claim 9, wherein the photoresist-isolating walls are formed in parallel so as to extend perpendicularly to the anode electrodes, and upright from the substrate.

* * * * *